(12) United States Patent
Perner et al.

(10) Patent No.: US 6,324,093 B1
(45) Date of Patent: Nov. 27, 2001

(54) WRITE-ONCE THIN-FILM MEMORY

(75) Inventors: Frederick A. Perner, Palo Alto; Thomas C. Anthony, Sunnyvale, both of CA (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/663,016

(22) Filed: Sep. 15, 2000

(51) Int. Cl.[7] .................................................. G11C 11/14
(52) U.S. Cl. ........................ 365/171; 365/55; 365/56
(58) Field of Search ............................. 365/171, 55, 66, 365/52, 63, 129

(56) References Cited

U.S. PATENT DOCUMENTS 6,104,632 * 8/2000 Nishimura ........................ 365/158
6,169,688 * 1/2001 Noguchi ............................ 365/171

* cited by examiner

*Primary Examiner*—Hoai V. Ho

(57) ABSTRACT

A data storage device includes a group of memory cells. Write-once operations may be performed by damaging the thin-film barriers of at least some of the memory cells. The data storage device may be a Magnetic Random Access Memory ("MRAM") device.

25 Claims, 7 Drawing Sheets

WRITE-ONCE THIN-FILM MEMORY

BACKGROUND OF THE INVENTION

The present invention relates to data storage devices. More specifically, the present invention relates to a write-once thin-film data storage device.

New types of non-volatile, thin-film memory include Magnetic Random Access Memory ("MRAM") based on spin dependent tunneling ("SDT") junctions. A typical SDT junction has a pinned ferromagnetic layer, a sense ferromagnetic layer and a thin insulating tunnel barrier sandwiched between the ferromagnetic layers. A logic value may be written to an SDT junction by applying a magnetic field that sets the SDT junction's magnetization orientation to parallel (logic value '0') or anti-parallel (logic value '1'). Relative orientation and magnitude of spin polarization of the ferromagnetic layers determine the resistance state (R or R+ΔR) of the SDT junction. The logic value stored in the SDT junction may be read by sensing the resistance of the SDT junction.

Another type of non-volatile, thin-film memory is polymer memory based on polar conductive polymer molecules. Data is stored as a "permanent polarization" in a polymer molecule (in contrast to an SDT junction, where data is stored as a 'permanent magnetic moment'). Polymer memory elements may be written by applying electric fields. The resistance state (R or R+ΔR) of a polymer memory element is dependent upon the orientation of polarization of the polymer molecules. Polymer memory elements may also be read by sensing their resistance.

These thin-film memory elements are re-writable. That is, data can be written to these elements many times.

Write-once memory, in contrast, allows data to be written only once. Write-once memory is commonly used to permanently store key chip information such as chip/manufacture ID, access codes and error maps.

Typical devices for storing key chip information include erasable programmable read-only memory ("EPROM") devices and fuse programmable devices. However, EPROM and fuse programmable devices do not offer the high density and low voltage features of MRAM and polymer memory devices. Moreover, EPROM and fuse programmable devices are not easily integrated with MRAM and polymer memory devices.

SUMMARY OF THE INVENTION

According to one aspect of the present invention, a data storage device includes a group of thin-film memory cells; and a circuit for applying a write potential to at least some of the memory cells. The memory cells have thin-film barriers that are damaged when the write potential is applied. Write-once operations may be performed by damaging the thin-film barriers of at least some of the memory cells.

Other aspects and advantages of the present invention will become apparent from the following detailed description, taken in conjunction with the accompanying drawings, illustrating by way of example the principles of the present invention.

DETAILED DESCRIPTION OF THE INVENTION

As shown in the drawings for purposes of illustration, the present invention is embodied in a data storage device including an array of thin-film memory cells and circuitry for reading and writing the memory cells. Write-once operations may be performed by damaging the thin-film barriers of at least some of the memory cells.

Figure 1:
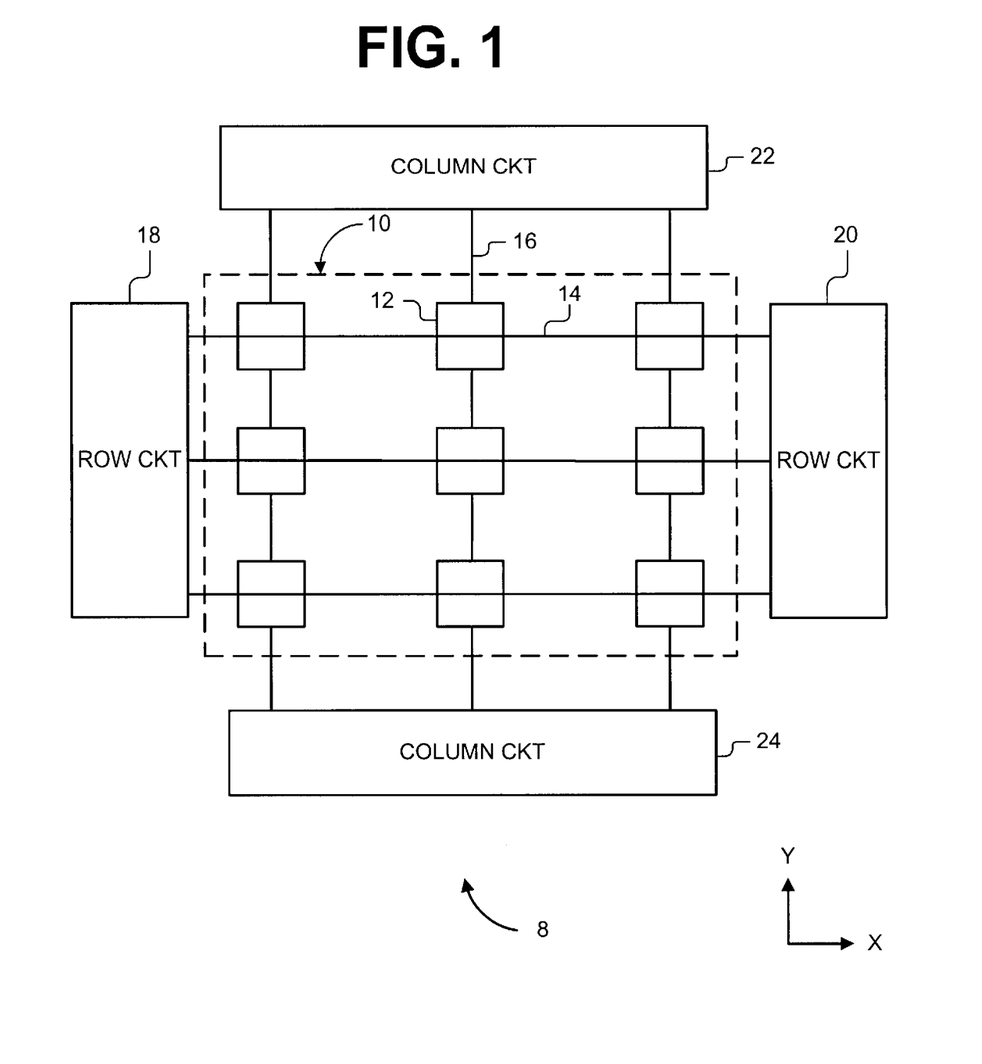
FIG. 1 is an illustration of a data storage device including an array of thin-film memory cells.

Reference is made to FIG. 1, which illustrates a data storage device 8 including a resistive cross-point array 10 of thin-film memory cells 12. The memory cells 12 are arranged in rows and columns, with the rows extending along an x-direction and the columns extending along a y-direction. Only a relatively small number of memory cells 12 are shown to simplify the explanation of the device 8. In practice, arrays of any size may be used.

Traces functioning as word lines 14 extend along the x-direction in a plane on one side of the array 10. Traces functioning as bit lines 16 extend along the y-direction in a plane on an opposite side of the array 10. There may be one word line 14 for each row of the array 10 and one bit line 16 for each column of the array 10. Each memory cell 12 is located at a cross point of a corresponding word line 14 and bit line 16.

The memory cells 12 form a resistive cross-point array because they include resistive elements that are coupled together through many parallel paths. The resistance seen at one cross point equals the resistance of the memory cell 12 at that cross point in parallel with resistances of memory cells 12 in the other rows and columns.

The device 8 further includes a read/write circuit (represented by first and second row circuits 18 and 20 and first and second column circuits 22 and 24) for applying read and write potentials to selected memory cells during read and write operations. To generate the read and write currents, the first and second row circuits 18 and 20 apply appropriate potentials to the word lines 14, and the first and second column circuits 22 and 24 apply appropriate potentials to the column lines 16.

The second column circuit 24 also includes sense amplifiers for sensing the resistance states of the selected memory cells. The resistance states indicate the stored logic values.

Sneak path currents may present a problem during read operations because the memory cells in the array are coupled together through many parallel paths. If not blocked, the sneak path currents tend to obscure the sensing.

There are different ways of blocking the sneak path currents during read operations. For example, the device 8 may include switches or diodes for isolating the selected cells and thereby blocking the sneak path currents.

In the alternative, the sneak path currents may be blocked by implementing an "equipotential" method disclosed in assignee's U.S. Ser. No. 09/564308 filed Mar. 3, 2000 and incorporated herein by reference. A read potential may be applied to the bit line crossing the selected memory cell and a ground potential may be applied to the word line crossing the selected memory cell. Consequently, a sense current flows through the selected memory cell. To prevent the sneak path currents from obscuring the sense current, the same potential is applied to a subset of unselected bit lines and unselected word lines.

During a write operation, the read/write circuit applies write potentials to selected word and bit lines 14 and 16. Consequently, electric or magnetic fields are created about the selected word and bit lines 14 and 16. A memory cell 12 seeing both fields (that is, a memory cell lying at a cross point of a selected word line and a selected bit line) is referred to as a "selected" memory cell. All of the other memory cells 12 along the selected word line 14 will see one of the two fields, and all of the other memory cells 12 along the selected bit line 16 will see the other of the two magnetic fields. These memory cells 12 seeing one of the two magnetic fields are referred to as "half-selected" memory cells. The remaining memory cells 12 in the array 10 are referred to as "unselected" memory cells.

A re-writable operation may be performed by applying first and second write potentials to the word and bit lines 14 and 16. Resulting is a field that sets the resistance state of the selected memory cell to a nominal value (R) or a higher value (R+ΔR). The first and second write potentials do not cause a dielectric breakdown of the thin-film barrier (e.g., tunnel insulating barrier) selected memory cell. Consequently, the resistance state can be changed repeatedly.

A write-once operation may be performed by applying third and fourth write potentials to the word and bit lines 14 and 16. The third and fourth write potentials do not cause dielectric breakdowns of the thin-film barriers of half-selected memory cells. However, the third and fourth potentials cause a dielectric breakdown of the thin-film barrier of the selected memory cell. Consequently, the third and fourth write potentials cause the thin-film barrier to become overstressed or damaged, and the selected memory cell is changed permanently to a low resistance state. Read currents do not cause damage to undamaged thin-film barriers. The resistance state of a write-once thin-film memory cell according to the present invention can be changed only once, from a high resistance state to a low resistance state.

One or more groups of the memory cells 12 may be designated for write-once operations and the remaining memory cells 12 may be designated for re-writable operations. In a group designated for write-once operations, the memory cells having damaged thin-films represent a first logic state and the memory cells having undamaged thin-films represent a second logic state.

The memory cells may be conveniently grouped by columns. That is, "write-once" columns of memory cells 12 may be designated for write-once operations and "re-writable" columns of memory cells 12 may be designated for re-writable operations. Such a grouping allows write circuits to be fabricated for the write-once columns and different write circuits to be fabricated for the re-writable columns. Write circuits for the write-once columns apply the third and fourth write potentials to selected memory cells, and write circuits for the re-writable columns apply the first and second write potentials to selected memory cells. In the alternative, a write circuit could be designed to apply either the first and second operating potentials to a selected memory cell or the third and fourth operating potentials to the selected memory cell.

The fabrication process for the array 10 need not be modified; memory cells 12 designated for write-once operations have the same construction as memory cells 12 designated for re-writable operations. However, the fabrication process should be controlled so that the breakdown parameters are controlled to a narrow range within limits set by write drivers for the read/write circuit.

Figure 2A:
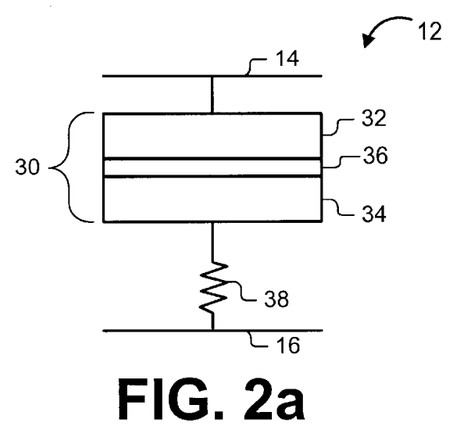
FIGS. 2a and 2b are illustrations of write-once memory cells at different logic states.
Figure 2B:
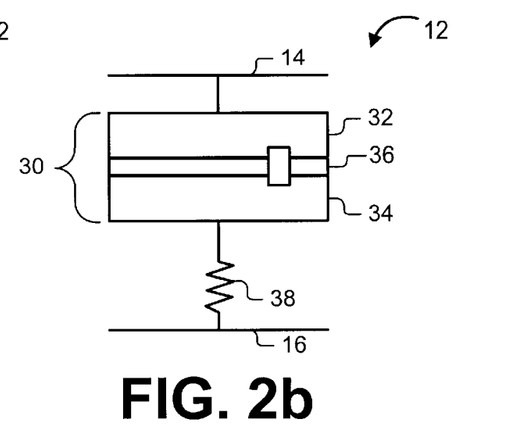

Reference is now made to FIGS. 2a and 2b, which show write-once thin-film memory cells 12 at different resistance states. Each thin-film memory cell 12 includes a resistive memory element 30. Each resistive memory element 30, in turn, includes first and second conductors 32 and 34 and a high-resistance thin-film barrier 36 therebetween. In an SDT junction, for example, the first conductor 32 may be a free ferromagnetic layer, the second conductor 34 may be a pinned ferromagnetic layer and the thin-film barrier 36 may be an insulating tunnel barrier. In a polymer memory element, the first conductor 32 may be a metal, the second conductor 34 may be a metal, and the thin-film barrier 36 may be a polymer memory material.

The thickness of the thin-film barrier 36 is selected so the barrier breaks down when the third and fourth write potentials are applied, but not when the first and second write potentials are applied. Dielectric breakdown generally occurs at a critical electric field rather than a critical voltage.

The thin-film barrier 36 of the memory cell 12 shown in FIG. 2a has not yet been broken down, overstressed or otherwise damaged. Therefore, the memory cell 12 has a nominal resistance that corresponds to the first logic value. When a sense current flows through a selected memory cell 12, the thin-film barrier does not break down.

The thin-film barrier of the memory cell 12 shown in FIG. 2b has already been broken down. Therefore, the memory cell 12 shown in FIG. 2b has a resistance that is lower than the nominal. This lower resistance corresponds to the second logic value.

The resistance of the resistive memory element 30 shown in FIG. 2a (undamaged barrier) may be on the order of 1 Megohm, and the resistance of the resistive memory element 30 shown in FIG. 2b (damaged barrier) may be on the order of 100 ohms to 10,000 ohms. In contrast, a resistive memory element of a re-writable memory cell may have a resistance on the order of 1 Megohm in one resistance state and 1.1 Megohm in the other resistance state.

If a memory element 30 has a resistance near zero, it might draw excessively large read and write currents during read and write operations. To prevent such a memory element 30 from drawing large currents, a resistor 38 may be connected in series with the resistive memory element 30. The resistance of the series-connected resistor 38 should be low enough to have a minimal effect on read operations and high enough to have minimal effect on write operations. Thus, the actual resistance of the series-connected resistor 38 should isolate the memory element 30 without degrading the sensing of the sense current during read operations and without degrading the write currents during write operations. The resistance range of the series-connected resistor 38 may be between 0.1% and 50% of the nominal. Thus, if the resistive memory element 30 has a damaged barrier 36, the resistance of the memory cell 12 will at least be equal to the resistance of the series-connected resistor 38. Assignee's U.S. Ser. No. 09/663,752 filed on Sep. 15, 2000 and entitled "SHORT-TOLERANT RESISTIVE CROSS POINT ARRAY", which is incorporated herein by reference, discloses resistive elements that are connected in series with memory elements.

Figure 3:
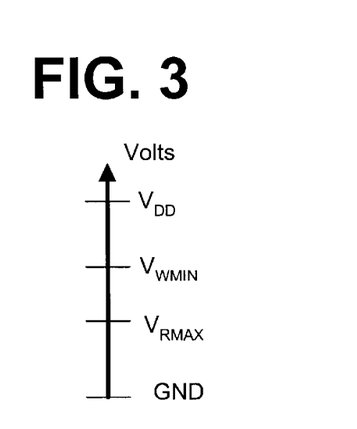
FIG. 3 is an illustration of read and write voltages for the write-once memory cells.

Reference is now made to FIG. 3, which illustrates the read and write voltages for the memory cells. The maximum read voltage ($V_{RMAX}$) is less than the minimum write-once voltage ($V_{WMIN}$). The voltage for a write-once operation is greater than the minimum write-once voltage ($V_{WMIN}$) and less than or equal to the full $V_{DD}$ voltage. Thus there is no overlap between the read and write-once voltages.

The voltage for a write-once operation is applied for a short interval. The dielectric breakdown occurs very quickly once the breakdown threshold is exceeded. A write-once operation could be performed within a single clock period (10 to 30 ns). Breakdown current could be monitored and the write-once voltage removed as soon as breakdown is detected. However, it would be simpler to apply the write-once voltage for a short, fixed period of time.

The voltage applied during a re-write operation is limited by the breakdown limits of the memory cell, which is at the maximum read voltage ($V_{RMAX}$). Thus, the voltage during a re-write operation is less than the maximum read voltage ($V_{RMAX}$). A typical voltage during a read operation is between ground potential (GND) and the voltage for the re-write operation.

Figure 4A:
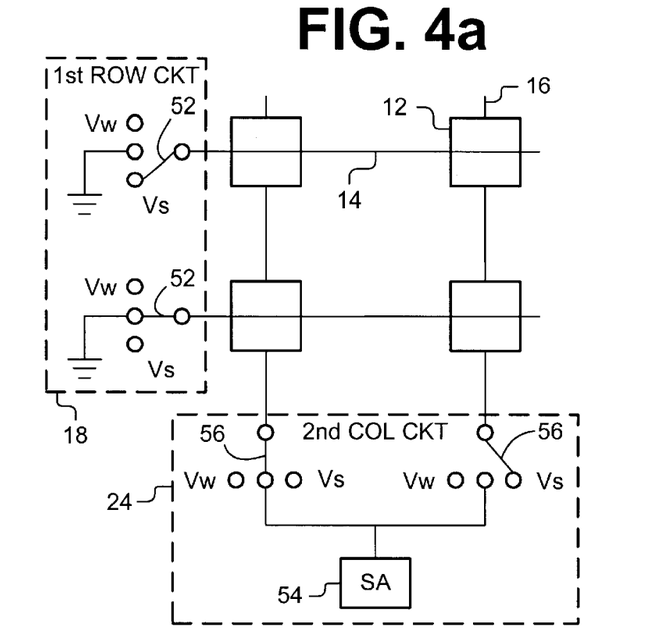
FIGS. 4a and 4b are illustrations of row and column circuits for the data storage device of FIG. 1.
Figure 4B:
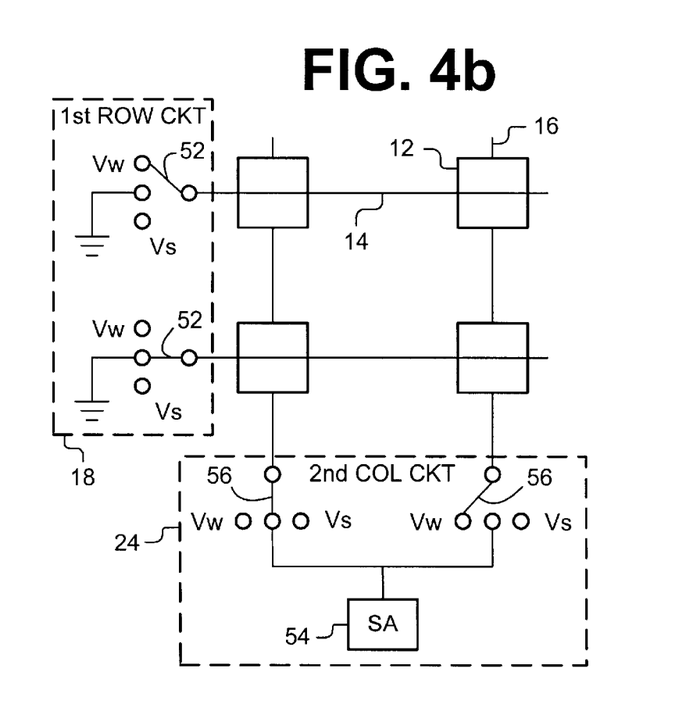

Reference is made to FIGS. 4a and 4b, which shows the first row and second column circuits 18 and 24 in greater detail. The first row circuit 18 includes a first switch 52 for each word line 14. The first switch 52 performs three functions: connecting the selected word lines 14 to ground for both read and write operations; connecting the unselected word lines 14 to the array voltage (Vs) during read operations (which allows equipotential reads to be performed); and connecting the unselected word lines 14 to the half-select write voltage (Vw) during a write-once operation. If write-once and re-write functionality is combined, the first switch 52 provides an open circuit for the unselected rows during re-write write operations. The half-select voltage (Vw) is less than the breakdown voltage.

During read and write-once operations, the second row circuit 20 connects all word lines to a high impedance (e.g., open switches). During a re-write operation, the second row circuit 20 applies a row write voltage to all the word lines 14 or, alternately, supplies the row write voltage to only the selected word lines 14 and connects the unselected word lines to a high impedance (e.g., open switches).

During read and write-once operations, the first column circuit 22 connects all bit lines 16 to a high impedance. During a re-write operation, the first column circuit 22 connects the selected bit line 16 to the circuits 18 to 24 and all the unselected bit lines 16 to a high impedance (e.g., open switches).

The second column circuit 24 includes a sense amplifier 54 and a plurality of second switches 56. Each second switch 56 performs three functions: connecting the selected column 16 to the input of the sense amplifier 54 during read and re-write operations; connecting the unselected bit lines 16 to the array voltage (Vs) during read operations; and connecting the unselected bit lines 16 to a half select voltage (Vw) during write-once operations. When connected to a selected bit line, the sense amplifier 54 senses the resistance state of selected memory cells during a read operation and applies a re-write potential during a re-write operation. During a write-once operation, the sense amplifier 54 applies a ground potential to write a logic '0' and twice the half-select voltage (2WV) to write a logic '1'. Applying twice the half-select voltage causes a breakdown.

FIG. 4a shows the first row circuit 18 and second column circuits 24 during a read operation. During a read operation, the first switches 52 tie a selected word line 14 to ground and unselected word lines 14 to the array voltage (Vs), and the second switches 56 connect a selected bit line 16 to the sense amplifier 54 and the unselected bit lines 16 to the array voltage (Vs). The sense amplifier 54 applies a read potential to the selected bit line and senses a sense current.

FIG. 4b shows the first row and second column circuits 18 and 24 during a write operation. During a write-once operation, the second switches 56 apply a write potential (either GND or 2*Vw) to one end of the selected bit line 16 and a half select write potential (Vw) to the unselected bit lines 16. The first switches 52 apply a write potential (GND) to the selected word line 14 and a half select write potential (Vw) to the unselected word lines 14. The cell 12 at the cross point of the selected bit line 16 and the selected word line 14 sees a voltage (2*Vw) greater than the breakdown voltage to write a logic '1' or a zero voltage to write a logic '0', while all the unselected memory cells see either a zero voltage or a half-select voltage.

Thus disclosed is write-once thin-film memory that has a higher density than EPROM and fuse programmable memory. The write-once thin-film memory also has lower voltage operation than EPROM and fuse programmable memory. The full $V_{DD}$ voltage can be used to overstress the thin-film barriers. Thus, lower energy is used to write the write-once thin-film memory cells than memory cells in fuse programmable devices. Lower energy, in turn, results in less structural damage and higher reliability. The lower read and write voltages also make the write-once thin-film memory compatible with leading edge CMOS technologies.

The write-once thin-film memory is fabricated with the same components and process technology used in fabricating re-writable thin-film memory. The fabrication process need not be changed to mix write-once and re-writable memory cells. Thus, unlike EPROM and fuse programmable memory, the write-once memory cells may be mixed on the same silicon substrate with the re-writable memory cells. Advantages of mixing the write-once and re-writable memory cells include the same basic memory cell structure; and a simpler design for the read circuits for the write-once memory, which allows a sub-set of the write-once memory to be automatically sensed during the power up cycle of the circuit. Another advantage is that write-once data is stored permanently and can be used for ID, security, power on configuration, or application code storage. Thus, separate chips are not needed to store key chip information such as chip/manufacture ID, access codes and error maps.

The write-once thin-film memory has a robust read operation. The difference between logic '1' and '0' states is relatively large. For example, a write '0' may be represented by a resistance of 1 Megohm, and a write '1' may be represented by a low resistance of 1,000 ohms. Such a large difference is relatively easy to detect, and it simplifies the read circuit design.

The device 8 is not limited to any particular type of thin-film memory. MRAM and polymer memory are but two types. MRAM memory elements may include SDT junctions and giant magnetoresistance ("GMR") devices.

If diodes or switches are used for blocking sneak path currents during read operations, the read circuitry need only apply appropriate potentials to the word and bit line crossing the selected memory cell in order to generate a sense current.

The write-once thin-film cells may be located anywhere in the array 10. However, the write-once memory cells may be separated from the re-writable memory cells to allow more robust sense amplifiers to be used for the write-once memory. Separate groups of write-once memory cells may be operated at power up to provide special functions such as setting up configuration data, error maps, or ID data.

Figure 5:
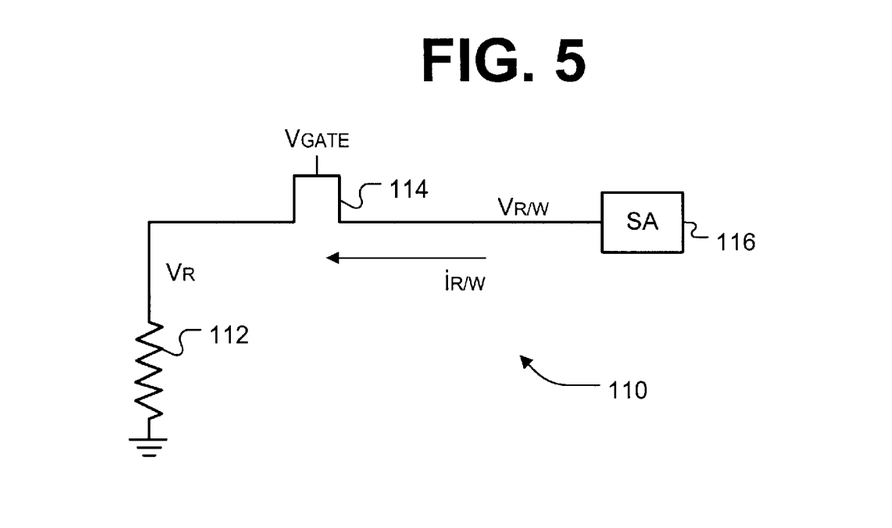
FIG. 5 is an illustration of an alternative write-once thin-film memory cell.
Figure 6:
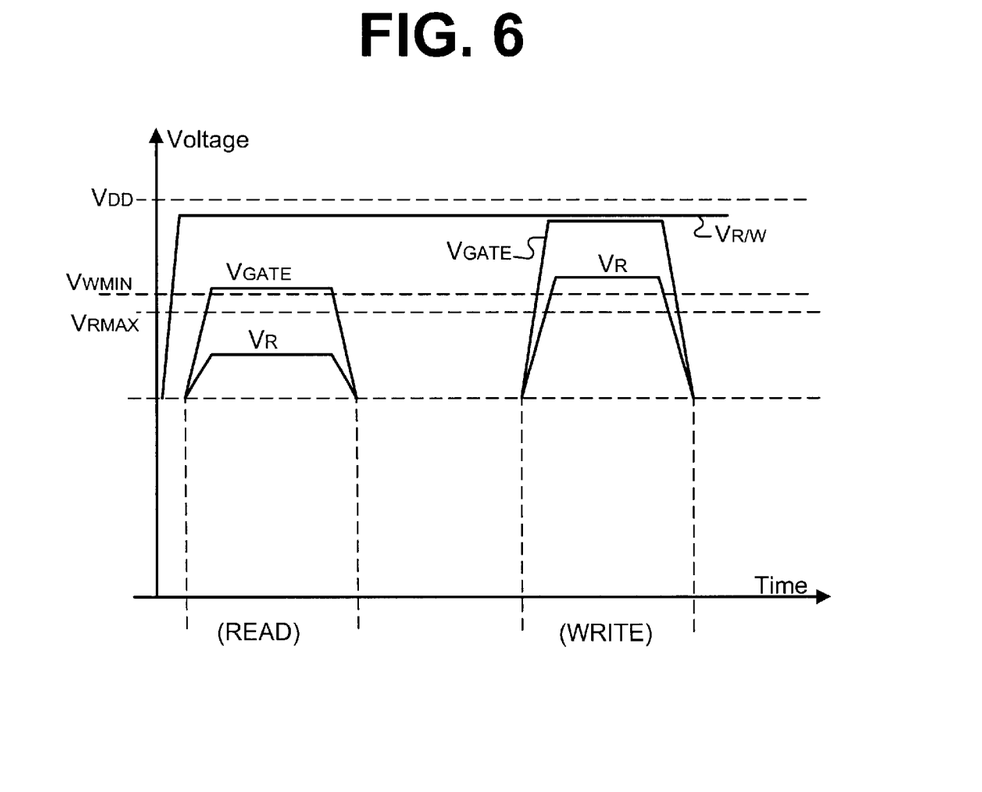
FIG. 6 is an illustration of read and write voltages for the alternative write-once thin-film memory cell.

FIG. 5 shows an alternative memory cell 110, which includes a write-once thin-film resistive memory element 112 and an access transistor 114 connected in series with the resistive memory element 112; and FIG. 6 shows voltages applied during read and write-once operations. During a read operation on the alternative memory cell 110, the access transistor 114 may be operated as a source follower. A voltage ($V_R$) applied across the write-once memory element 112 is approximately equal to the voltage ($V_{GATE}$) to the access transistor gate less the body effect threshold voltage of the access transistor 114. The gate voltage ($V_{GATE}$) is kept low in order to keep a low voltage ($V_R$) across the write-once memory element 112. The access transistor 114 functions as a current source, isolating the memory element 112 at the source of the access transistor 114 from a sense amplifier 116 coupled to the drain of the access transistor 114. Sense voltages ($V_{R/W}$) at the drain of the access transistor 114 may go high without damaging the thin-film barrier of the memory element 112 during read operations. The sense amplifier 116 can compare a sense current ($i_{R/W}$) to a threshold in order to determine the resistance state of the write-once memory element 112.

Data may be written to the memory cell 110 by applying the full $V_{DD}$ voltage to the gate and drain of the access transistor 114. Thus $V_{GATE}=V_{DD}$ and $V_{R/W}=V_{DD}$. The resulting voltage ($V_R$) applied to the memory element 112 causes the thin-film barrier to overstress and break down. Once the overstress occurs, the gate voltage ($V_{GATE}$) is removed. The gate voltage ($V_{GATE}$) may be applied for a duration of less than one clock period.

The access transistors 114 may be used only in the memory cells 110 designated for write-once operations, or they may be used in all of the memory cells 110. If used in all of the memory cells 110, the access transistors 114 may be controlled to prevent sneak path currents from obscuring the sense currents during read operations.

Figure 7:
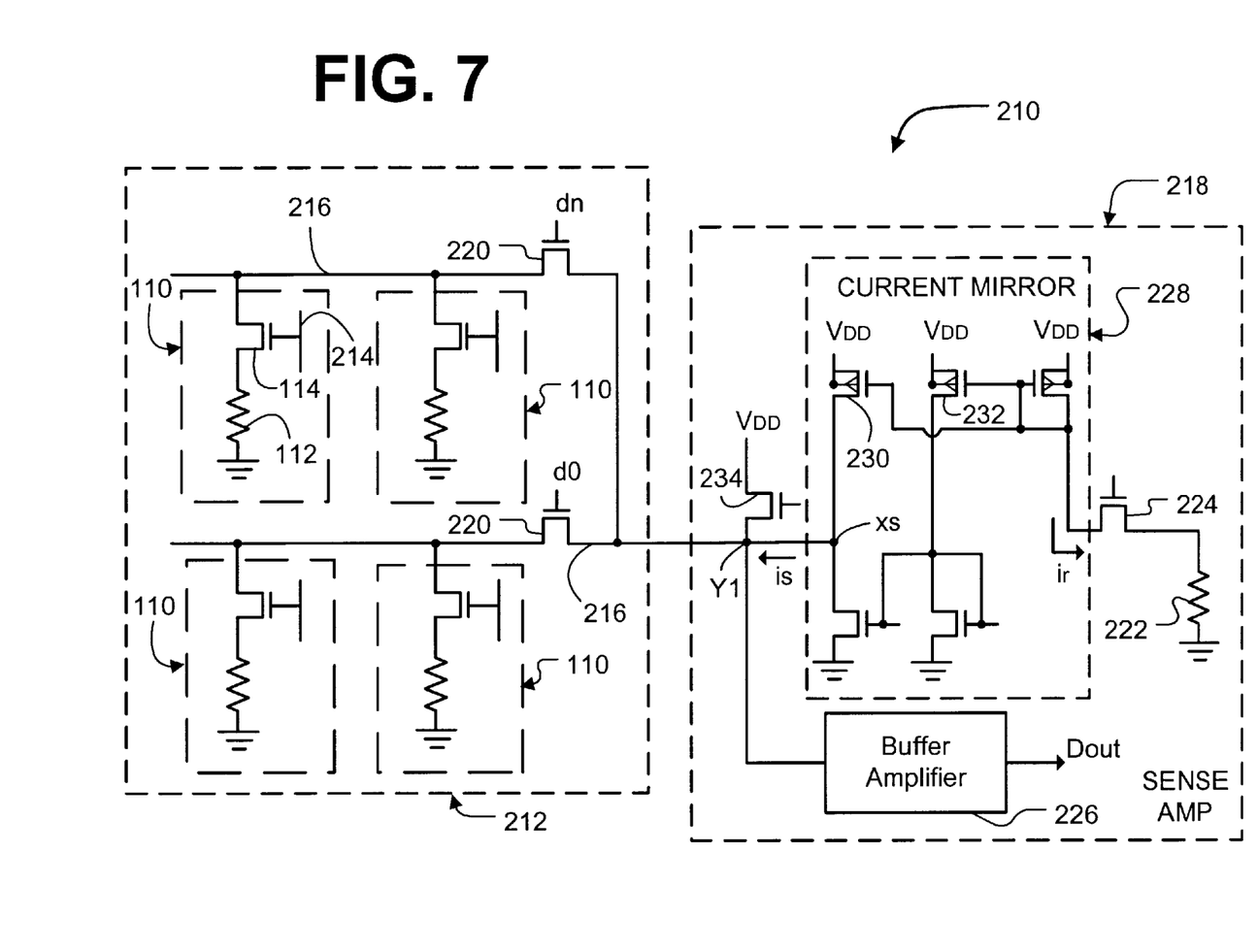
FIG. 7 is an illustration of a data storage device including the alternative write-once thin-film memory cells.

FIG. 7 shows a data storage device 210 including an array 212 of the alternative write-once memory cells 110. Gates of the access transistors 114 are connected to word lines 214 and drains of the access transistors 114 are connected to bit lines 216. The device 210 further includes a current mode sense amplifier 218 and bit line access transistors 220. A reference element 222 is used to provide a reference current ($i_r$) for comparison to the sense current ($i_s$).

During a read operation, a memory cell 110 is selected by selecting its crossing word and bit lines 214 and 216. Sense current ($i_s$) flows through the selected memory cell 110. In addition, a transistor 224 is closed, whereby reference current ($i_r$) flows through the reference element 222. Magnitude of the reference current ($i_r$) lies between the sense current corresponding to an undamaged barrier logic '0' and a sense current corresponding to a logic '1'. For example, the reference current magnitude may be four times the expected magnitude of sense current flowing through a memory cell having an undamaged barrier.

The current mode sense amplifier 218 includes a buffer amplifier 226 and a ratioed current mirror 228 for comparing the sense current ($i_s$) to a ratioed current mirror current to determine the resistance state of the selected memory cell 110. The ratioed current mirror 228 includes three p-channel transistors and two n-channel transistors. One p-channel transistor 230 is larger than its neighboring p-channel transistor 232. If, for example, the one p-channel transistor 230 is four times larger than its neighboring p-channel transistor 232, the sense current ($i_s$) is three times the reference current ($i_r$). The reference current ($i_r$) pulls up a sense node (xs) if the selected memory cell 110 does not have a damaged barrier (high resistance) and pulls down the sense node (xs) if the selected memory cell 110 has a damaged barrier (low resistance).

The buffer amplifier 224 may include a pair of inverters connected in series to function as a sense amplifier comparator and an output driver. The pair of inverters perform the function of buffering a high impedance node (node Y1) from circuits connected to the amplifier output (i.e., the pair of inverters buffer the input and output and amplify the input signal). The pair of inverters also function as a comparator: when the sense node (xs) is pulled below a switch threshold of the pair of inverters, the buffer amplifier 226 reports an output signal (Dout) representing a logic '0' and when the sense node (xs) is above the switch threshold, the output signal (Dout) represents a logic '1'. Thus the sense amplifier 218 functions as a current mirror comparator.

Data is written to the selected memory cell 110 by controlling the gate signals (d0 to dn) to the bit line access transistors 220 and a reset transistor 234 according to the write-once conditions described above in connection with FIGS. 5 and 6. The function of the reset transistor 234 is to pull the sense node (xs) high between read operations and to supply the write potential during the write operations as described in FIG. 6.

The present invention is not limited to memory cell arrays. For example, a write-once register may include the write-once thin-film memory cells. The write-once register does not have word lines. Memory cells are selected by selecting bit lines only. The full write potential applied to a selected bit line causes a dielectric breakdown in a selected memory cell.

Figure 8:
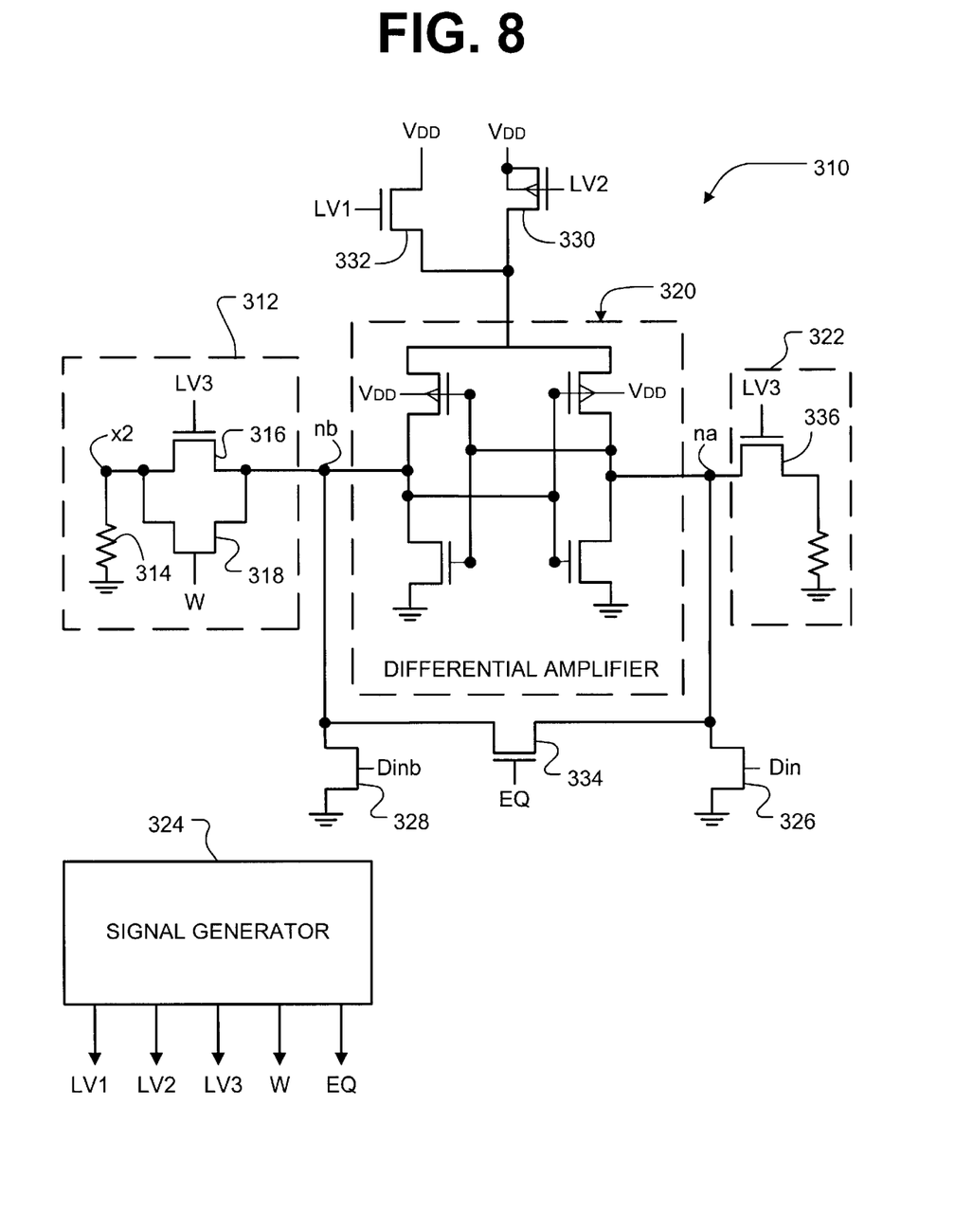
FIG. 8 is an illustration of a write-once thin-film memory register.

Reference is now made to FIG. 8, which shows a write-once register 310 including a memory cell 312. The memory cell 312 includes a thin-film element 314, an access transistor 316 and a write transistor 318. A drain-source path of the write transistor 318 is coupled across the drain-source path of the access transistor 316. The write-once register 310 further includes a differential amplifier 320 connected between first and second nodes (na and nb). The differential amplifier 320 is configured to sense a resistance difference between a reference cell 322 and the thin-film element 314 while maintaining a low read voltage on the reference cell 322 and the thin-film element 314. The differential amplifier 320 also applies the write voltage to the write-once thin-film element 314.

Figure 9:
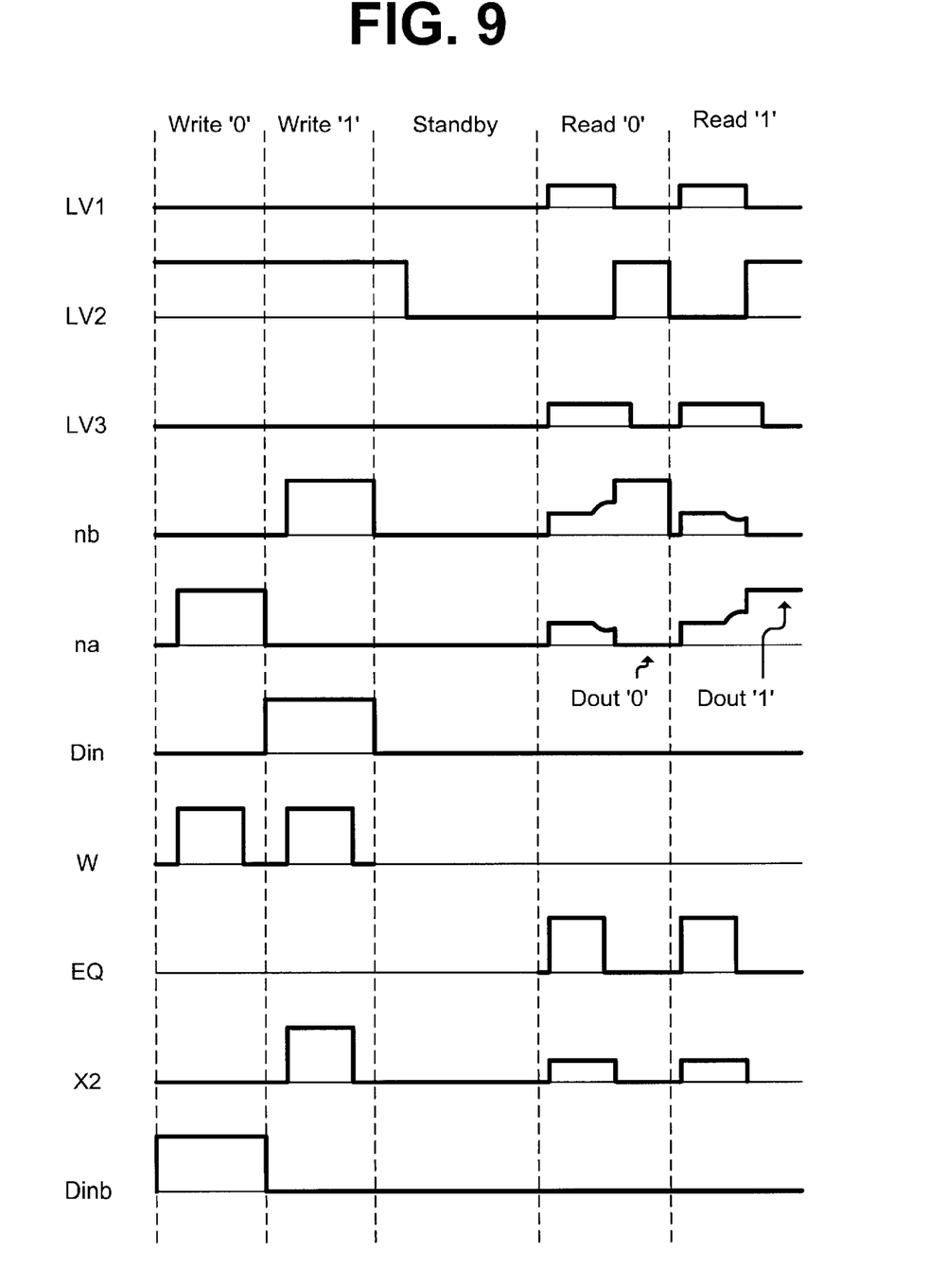
FIG. 9 is an illustration of clock signals for the write-once thin-film memory register.

Additional reference is made to FIG. 9. Read and write operations are controlled by first, second and third clock signals (LV1, LV2, LV3), an equalization signal (EQ) and a write signal (W). These signals are generated by a control signal generator 324.

A write data signal (Din) is supplied to the gate of a transistor 326 having its drain-source path coupled between the first node (na) and ground. A signal (Dinb) representing the compliment of the write data signal (Din) is supplied to the gate of a transistor 328 having its drain-source path coupled between the second node (nb) and ground. To write the register 310 reliably, the transistors 326 and 328 are controlled to pull down either the first or second node (na or nb) according to the level of the write data signal (Din).

A write operation is performed by turning on a p-channel transistor 330 (with the second clock signal LV2) to bring the internal node of the differential amplifier 320 to full VDD level, and supplying the write data signal (Din) to the gate of its transistor 326. If the data signal (Din) is low, then the voltage on the first node (na) is allowed to float and the voltage on the second node (nb) is forced low. Consequently, no voltage is applied to the write-once element 314 when the write signal (W) is asserted. Thus, if the resistance of the write-once element 314 is high when the write signal (W) is asserted, it remains high.

If, however, the data signal (Din) is high, the differential amplifier 320 is driven to full $V_{DD}$ voltage at the second node (nb). When the write access transistor 318 is turned on and the write signal W is asserted, the voltage on the second node (nb) is forced high to full $V_{DD}$ voltage, and the high voltage is applied to the thin-film element 314. The high voltage causes a dielectric breakdown in the thin-film element 314.

During a read operation, the differential amplifier 320 senses the stage of the thin-film element 314 in two steps. First an n-channel transistor 332 is turned on (by the first clock signal LV1) to bring the voltage on the first and second nodes (na and nb) to a low voltage (approximately $V_{DD}/2$). Next an equalization transistor 334 is turned on (by the equalization signal EQ) to force both nodes (na and nb) to an equal (low) voltage, and the access transistors 316 and 336 are turned on (by the third control signal LV3) to connect the memory and reference cells 312 and 322 to the inputs of the differential amplifier 320. When equalization signal EQ is removed, a differential voltage develops across the first and second nodes (na and nb). This differential voltage is determined by the resistance of the thin-film element 314 as compared to the resistance of the reference cell 322. The resistance of the reference cell 322 may have a value equal to the average value of the nominal resistance of the thin-film element 314 and its resistance in the low resistance state. After a short delay to allow the differential voltage develop, the third control signal (LV3) turns off the access transistors 316 and 336 to isolate the memory and reference cells 312 and 322 from the differential amplifier 320.

The second step is performed by turning on the p-channel transistor 330 to bring the nodes (na and nb) of the differential amplifier 320 to full $V_{DD}$ voltage. The full $V_{DD}$ voltage conveys the state of the register 310 as a full swing logic signal to the logic circuits connected to the data output of the register 310. The data output of the register 310 is taken from first node (na).

During the read operation, the thin-film memory element 314 is isolated from the full $V_{DD}$ by the access and write transistors 316 and 318, which are controlled by the third clock signal (LV3) and a write signal (W). The access transistor 316 functions as a voltage follower that limits the voltage $V_R$ to the gate voltage ($V_{GATE}$) less the body effect threshold voltages of the access transistor 316. The gate voltage on the access transistor 316 is limited by limiting the third clock signal (LV3) to a voltage less than the full $V_{DD}$ voltage (e.g., $V_{DD}/2$). The write signal (W) operates the write transistor 318 as an on-off switch. Thus high voltages at the second node (nb) are not applied to the thin-film memory element 314 during read operations.

The write-once thin-film memory is not limited to any particular application. It could be used for any low cost, permanent storage application. In addition to chip/manufacture ID, access codes, and error maps, applications for the write-once thin-film memory include write-once digital film for digital cameras, write-once MP3 digital audio storage, write-once user ID fields for passwords or security, program code storage, etc.

The present invention is not limited to the specific embodiments described and illustrated above. Instead, the invention is construed according to the claims that follow.

What is claimed is:

1. A data storage device comprising:
    a group of thin-film memory cells; and
    a circuit for applying write potentials to at least some of the memory cells;
    the memory cells having thin-film barriers that are damaged when the write potentials are applied.

2. The device of claim 1, wherein the group is an array of memory cells.

3. The device of claim 2, wherein the circuit applies first and second write potentials to word and bit lines crossing a first group of memory cells during re-write operations, the first and second write potentials not causing dielectric breakdown in selected memory cells of the first group; and wherein the circuit applies third and fourth write potentials to word and bit lines crossing a second group of memory cells during write-once operations, the third and fourth write potentials causing dielectric breakdown in selected memory cells of the second group.

4. The device of claim 3, wherein the circuit includes first sense amplifiers for the first group of memory cells and second sense amplifiers for the second group of memory cells, the first and second sense amplifiers sensing different resistance states during read operations.

5. The device of claim 3, wherein the memory cells of the first group can be switched between a nominal resistance corresponding to a first logic value and a second resistance state corresponding to a second logic value; wherein the memory cells of the second group have either the nominal resistance corresponding to the first logic value or a third resistance corresponding to the second logic value; and wherein the nominal, second and third resistances are different.

6. The device of claim 2, wherein at least some of the memory cells include memory elements and resistive elements, each resistive element being connected in series with a memory element.

7. The device of claim 6, wherein the resistive elements have a resistance between about 0.1% and 50% of nominal memory cell resistance.

8. The device of claim 2, wherein the circuit applies an equal potential to a selected bit line and a subset of unselected lines during read operations.

9. The device of claim 2, further comprising a plurality of word and bit lines, each memory cell being at a cross point of a word line and a bit line; and wherein the circuit includes:
    a sense amplifier;
    a first switch for each word line, each first switch connecting a selected row to ground for both read and write operations, connecting an unselected row to an array voltage during read operations, and connecting unselected rows to a half-select write voltage during write-once operations; and
    a second switch for each bit line, each second switch connecting a selected bit line to an input of the sense amplifier during read and write operations, connecting unselected bit lines to the array voltage during read operations, and connecting the unselected bit lines to a half-select voltage during write-once operations.

10. The device of claim 9, wherein the sense amplifier senses the resistance states of selected memory cells during read operations and applies re-write potentials to selected memory cells during re-write operations; and wherein during write-once operations, the sense amplifier applies a ground potential to write a logic '0' to selected memory cells and twice the half-select voltage to write a logic '1' to selected memory cells.

11. The device of claim 2, wherein at least some memory cells include memory elements and access transistors for the memory elements.

12. The device of claim 11, wherein voltages applied to the memory elements are controlled by controlling gate voltages of the access transistors.

13. The device of claim 11, wherein the circuit includes a sense amplifier including a ratioed current mirror and a buffer amplifier for sensing a resistance state of a selected memory cell.

14. The device of claim 1, wherein the group includes registers of write-once memory cells.

15. The device of claim 14, wherein each memory cell includes a memory element, and an access transistor for the memory element.

16. The device of claim 15, wherein voltages applied to the memory elements are limited by controlling gate voltages of the access transistors.

17. The device of claim 14, wherein the circuit includes a differential amplifier and a reference element, the differential amplifier indicating a difference between sense and reference currents flowing through selected memory cells and the reference elements during read operations on the selected memory cells, the differences indicating the resistance state of the selected memory cells.

18. The device of claim 14, wherein the circuit includes a differential amplifier having a node coupled to the memory cell, the differential amplifier generating a full write voltage during a write operation, the circuit further including a transistor for pulling down the node according to a state of an input line.

19. The device of claim 1, wherein the memory cells are MRAM cells.

20. The device of claim 1, wherein the memory cells include spin-dependent tunneling junctions.

21. A data storage device comprising:
a memory cell array including a first group of thin-film memory cells and a second group of thin-film memory cells; and
a plurality of word lines and bit lines for the array, each memory cell being at a cross point of a word line and a bit line; and
a circuit for applying first and second write potentials to word and bit lines crossing the first group of memory cells during re-write operations, the first and second write potentials not causing dielectric breakdown in selected memory cells of the first group, the circuit applying third and fourth write potentials to word and bit lines crossing the second group of memory cells during write-once operations, the third and fourth write potentials causing dielectric breakdown in selected memory cells of the second group.

22. A data storage device comprising:
a plurality of registers, each register including a thin-film memory element and an access transistor; and
a circuit for applying write potentials to at least some of the memory cells, the memory cells having thin-film barriers that are damaged when the write potentials are applied.

23. The device of claim 22, wherein the circuit includes a differential amplifier for each register, each different amplifier having a first node coupled to the element via the access transistor memory cell, each differential amplifier having a second node coupled to a reference cell, each differential amplifier generating a full write voltage during a write operation, the circuit further including a pull-down transistor for each register, each pull-down transistor pulling down the first node according to a state of a write signal.

24. The device of claim 22, wherein the circuit includes a differential amplifier for each register, each different amplifier having a first node coupled to a corresponding element via the access transistor memory cell, each differential amplifier having a second node coupled to a corresponding reference cell; and wherein the circuit uses a differential amplifier to perform a read operation on a selected register by bringing the nodes of the differential amplifier to a low voltage, then equalizing the voltages on the nodes and connecting the nodes to the corresponding memory element and reference cell, then allowing a differential voltage across the nodes to develop, then isolating the differential amplifier and then forcing the nodes to a full swing voltage, whereby at least one of the nodes indicates a sensed resistance state of the selected register.

25. A method of writing a group of memory cells in a data storage device, the memory cells having thin-film barriers, the method comprising:
breaking down the thin film barrier of at least one memory cell to write a first logic value; and
not breaking down the thin-film barrier of at least one other memory cell to write a second logic value.

* * * * *